(12) United States Patent
Song et al.

(10) Patent No.: US 10,423,257 B2
(45) Date of Patent: Sep. 24, 2019

(54) TOUCH SENSOR INTEGRATED WITH POLARIZER AND ORGANIC LIGHT EMITTING DISPLAY DEVICE

(71) Applicant: DONGWOO FINE-CHEM CO., LTD., Iksan-si, Jeollabuk-do (KR)

(72) Inventors: In Kyu Song, Pyeongtaek-si (KR); Hee Bong Kim, Pyeongtaek-si (KR); Jun Hee Sung, Incheon (KR); Min-Ho Lim, Seoul (KR)

(73) Assignee: DONGWOO FINE-CHEM CO., LTD., Iksan-si (KR)

( * ) Notice: Subject to any disclaimer, the term of this patent is extended or adjusted under 35 U.S.C. 154(b) by 2 days.

(21) Appl. No.: 15/572,497

(22) PCT Filed: Apr. 26, 2016

(86) PCT No.: PCT/KR2016/004368
§ 371 (c)(1),
(2) Date: Nov. 7, 2017

(87) PCT Pub. No.: WO2016/182231
PCT Pub. Date: Nov. 17, 2016

(65) Prior Publication Data
US 2018/0143715 A1 May 24, 2018

(30) Foreign Application Priority Data

May 8, 2015 (KR) .................. 10-2015-0064400
Apr. 26, 2016 (KR) .................. 10-2016-0050615

(51) Int. Cl.
*G06F 3/045* (2006.01)
*G06F 3/041* (2006.01)
(Continued)

(52) U.S. Cl.
CPC ............ *G06F 3/0412* (2013.01); *G06F 3/044* (2013.01); *H01L 27/323* (2013.01);
(Continued)

(58) Field of Classification Search
CPC ........ G06F 3/041; G06F 3/0412; G06F 3/044; G06F 2203/04102; G06F 2203/04111;
(Continued)

(56) References Cited

U.S. PATENT DOCUMENTS 9,423,915 B2    8/2016  Kang et al.
10,078,388 B2 * 9/2018  Song ..................... G06F 3/0412
(Continued)

FOREIGN PATENT DOCUMENTS

EP          2 648 079 A1    10/2013
KR     10-2014-0139126 A    12/2014
(Continued)

OTHER PUBLICATIONS

Translation of 10 pages of Specification and 2 pages of Claims of Korea Pub. No. KR 10-1485774, Jan. 2015, by Dongwoo Fine-Chem co., Ltd. (Year: 2015).*

*Primary Examiner* — Joe H Cheng
(74) *Attorney, Agent, or Firm* — Maschoff Brennan

(57) ABSTRACT

A touch sensor integrated with a polarizer according to an embodiment includes a polarizer; and a touch sensor which is disposed above a side of one surface of the polarizer and includes a substrate and electrode patterns formed on one surface of the substrate, wherein the sum of thicknesses of the polarizer and the touch sensor is in a range of 30 to 300 μm and strength of the substrate is 1 MPa or more.

12 Claims, 6 Drawing Sheets

(51) Int. Cl.
*G06F 3/044* (2006.01)
*H01L 27/32* (2006.01)
*H01L 51/52* (2006.01)
*H01L 51/00* (2006.01)

(52) U.S. Cl.
CPC ............... *H01L 51/5281* (2013.01); *G06F 2203/04102* (2013.01); *G06F 2203/04103* (2013.01); *H01L 51/0097* (2013.01); *H01L 2251/5338* (2013.01); *H01L 2251/558* (2013.01)

(58) Field of Classification Search
CPC ... H01L 27/32; H01L 27/323; H01L 51/0097; H01L 51/5281; H01L 51/5293; H01L 2251/5338
See application file for complete search history.

(56) References Cited

U.S. PATENT DOCUMENTS

| | | | | |
|---|---|---|---|---|
| 2005/0073507 | A1* | 4/2005 | Richter | G06F 3/044 345/174 |
| 2009/0051640 | A1* | 2/2009 | Tanaka | G02F 1/136286 345/92 |
| 2010/0265207 | A1* | 10/2010 | Chen | G06F 3/0412 345/174 |
| 2011/0229730 | A1 | 9/2011 | Yosomiya et al. | |
| 2012/0313880 | A1* | 12/2012 | Geaghan | G06F 3/044 345/173 |
| 2013/0127739 | A1* | 5/2013 | Guard | G06F 3/044 345/173 |
| 2013/0314648 | A1* | 11/2013 | Rappoport | G02B 1/118 349/96 |
| 2014/0192277 | A1* | 7/2014 | Yilmaz | G06F 3/0412 349/12 |
| 2015/0210590 | A1* | 7/2015 | Chang | C03C 21/002 428/220 |
| 2016/0132175 | A1* | 5/2016 | Tsuei | G06F 3/0412 345/173 |
| 2016/0147346 | A1* | 5/2016 | Lee | G06F 3/0412 345/173 |
| 2016/0237319 | A1* | 8/2016 | Takarada | G02B 5/3025 |
| 2016/0283025 | A1* | 9/2016 | Yang | G06F 3/044 |
| 2018/0157350 | A1* | 6/2018 | Song | G09F 9/30 |

FOREIGN PATENT DOCUMENTS

| | | |
|---|---|---|
| KR | 10-1485774 B1 | 1/2015 |
| KR | 10-2015-0012389 A | 2/2015 |
| KR | 10-2015-0039123 A | 4/2015 |

* cited by examiner

TOUCH SENSOR INTEGRATED WITH POLARIZER AND ORGANIC LIGHT EMITTING DISPLAY DEVICE

This is the U.S. National Stage of International Patent Application No. PCT/KR2016/004368, filed Apr. 26, 2016, which in turn claims the benefit of Korea Patent Application No. 10-2015-0064400, filed May 8, 2015 and Korea Patent Application No. 10-2016-0050615, filed Apr. 26, 2016.

TECHNICAL FIELD

The present invention relates to a touch sensor integrated with a polarizer.

The present invention also relates to an organic light emitting display device.

BACKGROUND ART

Recently, a touch panel which accomplishes an input function by having fingers or input devices, such as a stylus, to touch an image displayed on a display device is used in various electronic devices.

Such a touch panel may be mainly classified into a resistive film type and a capacitive type touch panel. The resistive film type touch panel detects a position by detecting a shorting between glass and an electrode due to a pressure on the input device. The capacitive type touch panel detects a position by detecting a capacitance change between electrodes occurring when a finger touch the panel.

The performance of the resistive film type touch panel may be degraded and scratches may occur due to repeated using. Accordingly, an interest in the capacitive type touch panel whose durability is excellent and lifetime is long is increasing.

A panel of the capacitive type touch panel is defined with an effective region through which a command input can be performed by a touch and an ineffective region surrounding the effective region. In the effective region, an electrode pattern is formed of a transparent conductive material to transmit light from the display device, and in the ineffective region, a interconnection pattern is formed of a conductive material.

Recently, bendable and foldable flexible display devices have been developed, and in order to realize the display devices, a bendable touch panel is required. When the touch panel is bent, there is a problem in that the electrode patterns and interconnection patterns crack and failures of the touch panel occur.

DISCLOSURE

Technical Problem

The present invention is directed to a touch sensor integrated with a polarizer capable of preventing cracks when the touch sensor is repeatedly bent.

The present invention is also directed to an organic light emitting display device capable of preventing failures of touch modules which are applied to flexible, curved, and bendable displays.

Aspects of the present invention are not limited thereto, and additional aspects will be apparent to those of ordinary skill in the art from the following description and the appended drawings.

Technical Solution

According to an aspect of the present invention, there is provided a touch sensor integrated with a polarizer according to an embodiment including a polarizer, and a touch sensor which is disposed above a side of one surface of the polarizer and includes a substrate and electrode patterns formed on one surface of the substrate, wherein the sum of thicknesses of the polarizer and the touch sensor is in a range of 30 to 300 μm, and strength of the substrate is 1 MPa or more.

Aspects of the present invention are, however, not limited thereto, and additional aspects will be apparent to those of ordinary skill in the art from the following description and the appended drawings.

Advantageous Effects

According to the present invention, in the touch sensor integrated with the polarizer and an organic light emitting display device according to the embodiment of the present invention, a crack, which can occur at a pattern layer when the touch sensor is repeatedly bent, can be prevented from occurring by setting a distance between a neutral region and a pattern layer to be a ratio relative to a total thickness of a touch module, and thus a disconnection failure can be prevented.

According to the present invention, in the touch sensor integrated with the polarizer and organic light emitting display device according to the embodiment of the present invention, a failure due to damage, which occurs when the touch sensor is bent, is prevented by forming a substrate to have strength and a total thickness of specific values, and thus production yield can be increased.

Effects of the present invention are not, however, limited thereto, and additional effects will be apparent to those of ordinary skill in the art from the following description and the appended drawings.

MODES OF THE INVENTION

Figure 1:
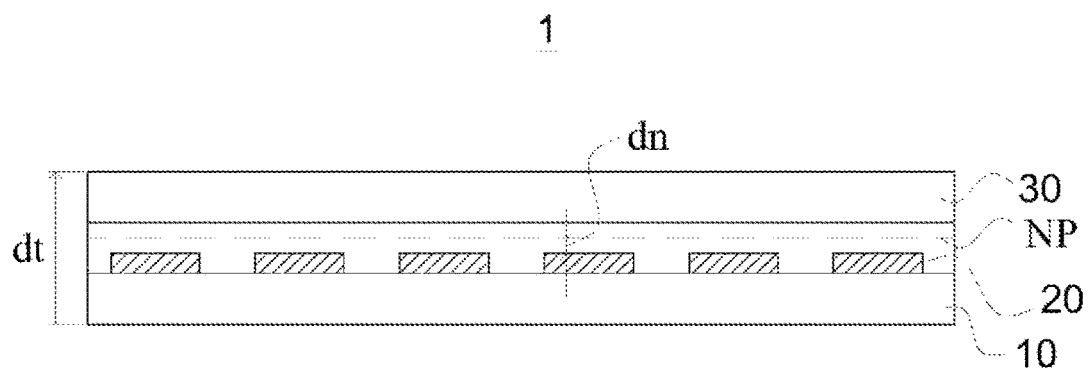
FIG. 1 is a cross-sectional view illustrating a touch module according to a first embodiment.

Hereinafter, specific embodiments of the present invention will be described in detail with reference to accompanying drawings. However, the scope of the present invention is not limited to the suggested embodiments, and other embodiments which are included in retrograde inventions or in the scope of the present invention may be easily suggested by those skilled in the art by adding, modifying, and deleting other components in the same scope of the present invention, this may also be within the scope of the present invention.

In addition, components which are illustrated in drawings for embodiments and have the same function in the same scope are assigned to and described with the same reference numerals.

A touch sensor integrated with a polarizer according to an embodiment includes the polarizer, and a touch sensor which is disposed above a side of one surface of the polarizer and includes a substrate and electrode patterns formed on one surface of the substrate, wherein the sum of thicknesses of the polarizer and the touch sensor is in a range of 30 to 300 μm, and a strength of the substrate is 1 MPa or more.

A distance between a neutral region and the electrode pattern of the touch sensor integrated with a polarizer may be in a range of 3 to 20% of a thickness of the touch sensor integrated with a polarizer.

The polarizer may be positioned on the electrode patterns.

The polarizer may be positioned under the substrate.

The polarizer may further include a retardation plate.

A thickness of the touch sensor may be in a range of 15 to 50 μm.

A thickness of the polarizer may be in a range of 5 to 100 μm.

A thickness of the retardation plate may be in a range of 10 to 25 μm.

The touch sensor integrated with the polarizer may further include a passivation layer formed on the electrode pattern.

The electrode pattern may be formed of molybdenum, silver, aluminum, copper, palladium, gold, platinum, zinc, titanium, chrome, nickel, tungsten, or an alloy including two or more thereof, or formed of indium tin oxide (ITO), indium zinc oxide (IZO), zinc oxide (ZnO), indium zinc tin oxide (IZTO), cadmium tin oxide (CTO), copper oxide (CO), poly 3,4-ethylenedioxythiophene (PEDOT), a nanowire, a nanofiber, carbon nanotube (CNT), or graphene.

The touch sensor integrated with the polarizer may further include a cover film positioned on the touch sensor.

An organic light emitting display device according to an embodiment may include the touch sensor integrated with the polarizer.

A thickness of the organic light emitting display device including the touch sensor integrated with the polarizer may be in a range of 40 to 388 μm.

Hereinafter, a touch module and a display device according to embodiments will be described with reference to accompanying drawings.

Figure 2:
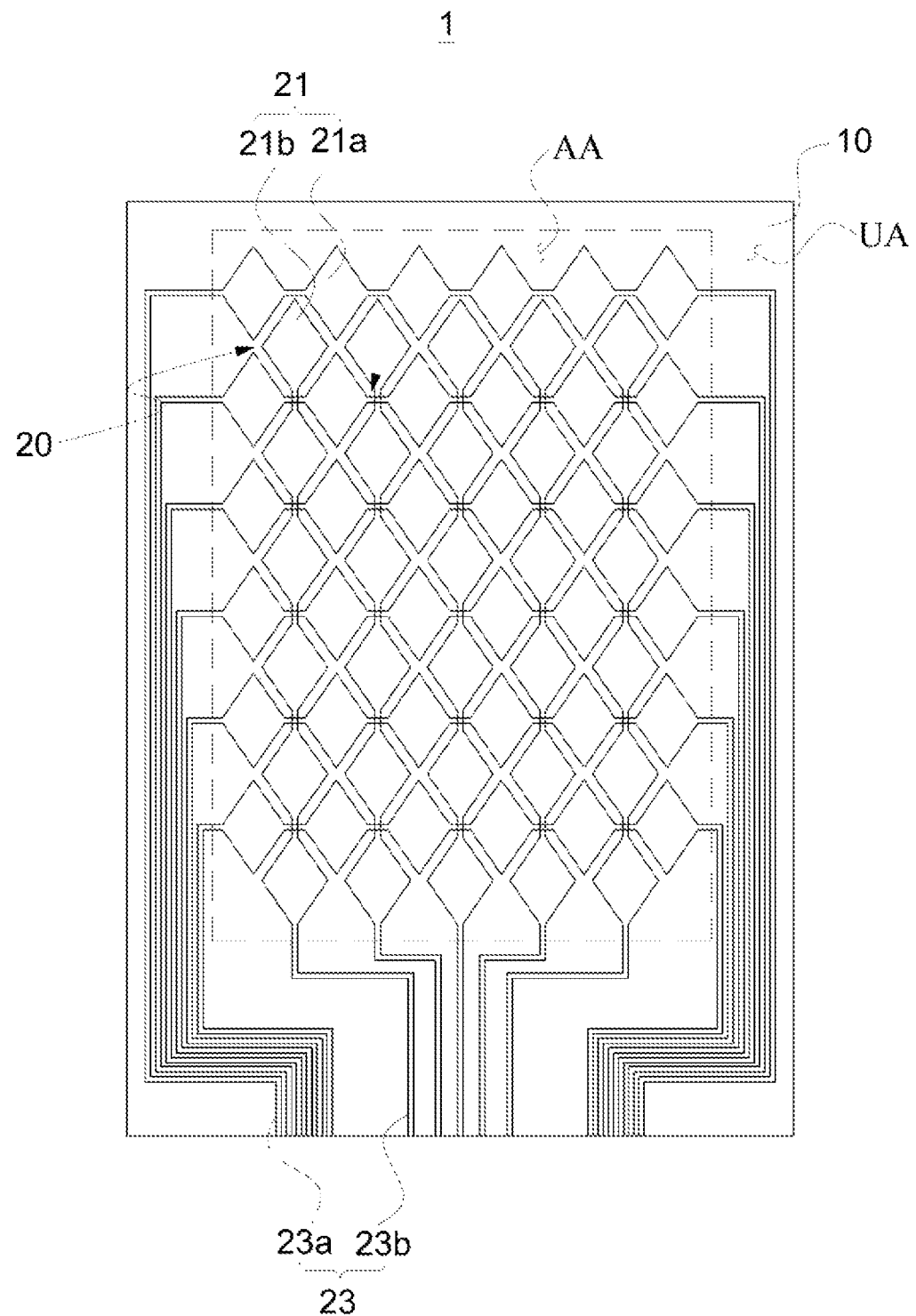
FIG. 2 is a top view illustrating the touch module according to the first embodiment.
Figure 3:
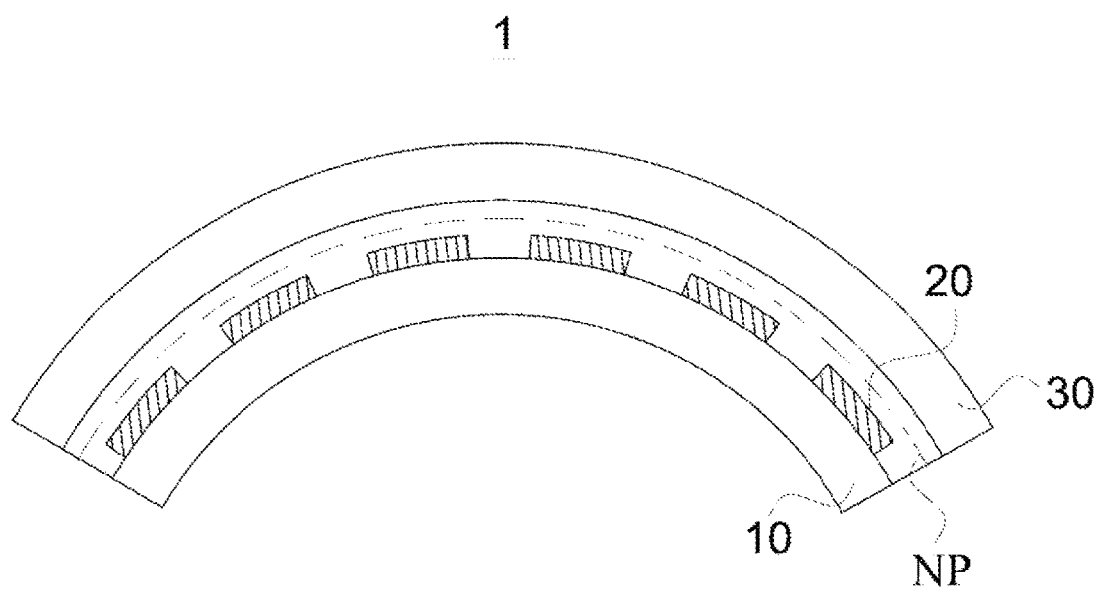
FIG. 3 is a cross-sectional view illustrating the touch module according to the first embodiment when the touch module is bent.

FIG. 1 is a cross-sectional view illustrating a touch module according to a first embodiment, FIG. 2 is a top view illustrating the touch module according to the first embodiment, and FIG. 3 is a cross-sectional view illustrating the touch module according to the first embodiment when the touch module is bent.

Referring to FIGS. 1 to 3, a touch module 1 according to the first embodiment includes a substrate 10, a pattern layer 20, and a light conversion layer 30.

The substrate 10 and the pattern layer 20 may form a touch sensor.

The substrate 10 may have a bent structure. The substrate 10 may be formed in a structure having a curvature. A thickness of the substrate 10 may be in a range of 10 to 40 μm. Strength of the substrate 10 may be 1 MPa or more. When the strength of the substrate 10 is less than 1 MPa and when the substrate 10 is repeatedly bent, the substrate 10 may be damaged because the strength thereof is degraded. However, by forming the substrate 10 to have 1 MPa or more of strength, failures due to damage of the substrate 10 may be prevented when the substrate 10 is bent.

The substrate 10 may include an effective region AA and an ineffective region UA.

The effective region AA refers to a region in which a user may perform a touch command input, and the ineffective region UA which is positioned surrounding the effective region AA refers to a region in which a touch command input is not performed because the ineffective region UA is deactivated even when the user touches the ineffective region UA.

When the substrate 10 is adhered to a display panel to be used, the effective region AA and the ineffective region UA of the substrate 10 may respectively correspond to a display region and a non-display region of a display device. The display region includes a region in which images are displayed, and the non-display region includes a region in which images are not displayed. Accordingly, the effective region AA of the substrate 10 may include a region through which light is transmitted, and the ineffective region UA of the substrate 10 may include a region through which light is not transmitted.

The substrate 10 may include at least one of cellulose triacetate, cellulose propionate, cellulose butyrate, cellulose acetate propionate, nitrocellulose, polyimide, polycarbonatea polyethylene terephthalate, polyehtylene naphthalate, a poly-1,4-cyclohexane dimethylene terephthalate, polyethylene 1,2-diphenoxy ethane-4,4'-dicarboxylate, polybutylene-terephtalate, polystyrene, polypropylene, polyethylene, polymethylpentene, polysulphone, polyethersulphone, polyallylate, polyetherimide, polymethylmetaacrylate, polyetherkethone, polyvinyl alcohol, and polyvinyl chloride cyclo olefin.

The pattern layer 20 may be formed on the substrate 10. The pattern layer 20 may include electrode patterns 21 and interconnection patterns 23.

The electrode patterns 21 may be formed in the effective region AA, and the interconnection patterns 23 may be formed in the ineffective region UA.

The electrode pattern 21 may include first electrode patterns 21a and second electrode patterns 21b.

The plurality of first electrode patterns 21a may be arranged in a first direction, and the plurality of second electrode patterns 21b may be arranged in a second direction. The second direction may intersect the first direction.

Each of the first electrode patterns 21a may be electrically connected to the adjacent first electrode patterns 21a, and each of the second electrode patterns 21b may be connected to the adjacent second electrode patterns 21b. Each of the first electrode patterns 21a and the second electrode patterns 21b may be defined as a unit conductive pattern. A touch pixel may be formed by at least one unit conductive pattern.

The electrode pattern 21 may be formed of a transparent conductive material. The electrode pattern 21 may be formed of molybdenum, silver, aluminum, copper, palladium, gold, platinum, zinc, titanium, chrome, nickel, tungsten, or an alloy including two or more thereof; or formed of ITO, IZO, ZnO, IZTO, CTO, CO, PEDOT, a nanowire, a nanofiber, CNT, or graphene.

The interconnection pattern 23 may include first interconnection patterns 23a and second interconnection patterns 23b.

The first electrode patterns 21a may be electrically connected to the first interconnection patterns 23a. The first electrode patterns 21a may be formed integrally with the first interconnection patterns 23a, and the first electrode patterns 21a may be formed separately from the first interconnection patterns 23a.

The second electrode patterns 21b may be electrically connected to the second interconnection patterns 23b. The second electrode patterns 21b may be formed integrally with the second interconnection patterns 23b, and the second electrode patterns 21b may be formed separately from the second interconnection patterns 23b.

The interconnection pattern 23 may be formed of a transparent conductive material. When the interconnection pattern 23 includes the transparent conductive material, the interconnection pattern 23 may include at least one conductive material selected from a group including ITO, copper oxide, carbon nanotube, CNT, a metal mesh, a Ag nanowire, a conductive film (PEDOT:polystyrene sulfonate (PSS)), and a nanofiber.

Alternatively, the interconnection patterns 23 may include a metal material having low resistivity. When the interconnection patterns 23 include the metal material having low resistivity, the interconnection patterns 23 may include at least one conductive material selected from a group including Cr, Ni, Al, Pt, Au, W, Cu, and Mo.

A thickness of the pattern layer 20 may be in a range of 5 to 10 μm.

A thickness of the substrate 10 and the pattern layer 20 may be in a range of 15 to 50 μm. That is, the sum of the thicknesses of the substrate 10 and the pattern layer 20 may be in a range of 15 to 50 μm. In other words, a thickness of the touch sensor may be in a range of 15 to 50 μm.

When the thickness of the touch sensor is less than 15 μm, handling during moving between processes is not easy, and a failure possibility during processing increases.

When the thickness of the touch sensor is greater than 50 μm, since a compressive strain which acts when the touch sensor is bent increases, there are problems of a part of the touch sensor cracking when the touch sensor is repeatedly bent and of an increased total thickness of the display device.

By forming the touch sensor to have the total thickness in the rage of 15 to 50 μm, there is an effect of an increased production yield due to a reduced failure rate during processing or a failure rate due to damage.

The light conversion layer 30 may be positioned on the pattern layer 20. The light conversion layer 30 may convert direction and phase of light which is transmitted through the light conversion layer 30 and output the light.

The light conversion layer 30 may include the polarizer and a retardation plate.

When the light conversion layer 30 includes the polarizer, the light conversion layer 30 may convert transmitted light into polarized light and output the polarized light. The polarizer may include a transmission axis and an absorption axis. The component of light entering the polarizer that is parallel to the transmission axis is transmitted to result in polarized light, the remaining light is absorbed, and as a result, polarized light may be output.

When the light conversion layer 30 includes the retardation plate, the light conversion layer 30 may shift phase of transmitting light and output the light. The retardation plate may be a quarter wave plate (QWP) which delays one polarization component of the incident light by λ/4, through which, when circularly polarized light is incident on the retardation plate by the retardation plate, the circularly polarized light may be converted into linearly polarized light, and when linearly polarized light is incident, the linearly polarized light may be converted into circularly polarized light.

The light conversion layer 30 may include the polarizer or the retardation plate, or the light conversion layer 30 may include both of the polarizer and the retardation plate.

When the light conversion layer 30 includes at least the polarizer, a structure including the polarizer and the touch sensor may be defined as the touch sensor integrated with the polarizer. That is, the touch module 1 including the polarizer may be defined as the touch sensor integrated with the polarizer.

A thickness of the light conversion layer 30 may be in a range of 25 to 75 μm. The thickness of the polarizer may be in a range of 15 to 50 μm, and the thickness of the retardation plate may be in a range of 10 to 25 μm.

Alternatively, the thickness of the light conversion layer 30 may be in a range of 5 to 250 μm. The thickness of the polarizer may be in a range of 5 to 100 μm.

When the thickness of the polarizer is less than 5 um, handling during moving between processes is not easy, and a failure possibility during processing increases.

When the thickness of the polarizer is greater than 100 μm, since compressive strain which acts when the polarizer is bent increases, there is a problem of the polarizer cracking when the polarizer is repeatedly bent. In addition, since a distance between the touch sensor and a touch finger is increased, an amount of capacitance change when the finger touch the touch sensor is decreased, and thus there is a problem of a lowered sensitivity to touch.

By forming the polarizer to have the thickness in the rage of 5 to 100 μm, there is an effect of an increased production yield due to a reduced failure rate during processing or a failure rate due to damage. In addition, there is an effect of an improved sensitivity to touch.

A thickness of the retardation plate may be in a range of 10 to 150 μm.

When the retardation plate is less than 10 μm, handling during moving between processes is not easy, and a failure possibility during processing increases.

When the thickness of the retardation plate is greater than 150 μm, since compressive strain which acts when the retardation plate is bent, there are problems of the retardation plate cracking when the retardation plate is repeatedly bent. In addition, since a distance between the touch sensor and a touch finger is increased, an amount of capacitance change when the finger touch the touch sensor is decreased, and thus there is a problem of a lowered sensitivity to touch.

By forming the retardation plate to have the thickness in the rage of 10 to 150 μm, there is an effect of an increased production yield due to a reduced failure rate during processing or a failure rate due to damage. In addition, there is an effect of an improved sensitivity to touch. Although not illustrated, the pattern layer may be coated with a passivation layer. The passivation layer may serve to protect the pattern layer.

A total thickness dt of the touch module 1 may be in a range of 30 to 300 μm.

When the total thickness dt of the touch module 1 is less than 30 μm, handling during moving between processes is not easy, and a failure possibility during processing increases.

When the total thickness dt of the touch module 1 is greater than 300 μm, strain which acts when the touch module 1 is bent increases, and there is a problem of parts of components of the touch module 1 cracking when the touch module 1 is repeatedly bent.

By forming the touch module 1 to have the total thickness dt in the range of 30 to 300 μm of, there is an effect of an improved production yield due to a reduced failure rate during processing or a failure rate due to damage.

A neutral region NP may be included inside the touch module 1.

The neutral region NP refers to a position where compressive strain or tensile strain does not act when the touch module 1 is bent. For example, as illustrated in FIG. 3, when the touch module 1 is bent, the compressive strain acts in an inner direction of the bent touch module 1, and the tensile strain acts in an outer direction of the bent touch module 1. Accordingly, the acting strain is gradually changed from the compressive strain to the tensile strain from an inner side to an outer side of the bent touch module 1. In addition, at a critical position, there is a transition position where the compressive strain and the tensile strain do not act, and this position is the neutral region NP.

A distance between the pattern layer 20 and the neutral region NP may be defined as a separation distance dn. The separation distance dn may be a distance between a top surface of the pattern layer 20 and the neutral region NP. The separation distance dn may be in a range of 3 to 20% of the total thickness dt.

By setting the separation distance dn in a range of 3 to 20% of the total thickness dt, damage of the pattern layer 20 and the light conversion layer 30 may be prevented.

When the separation distance dn is set to be less than 3% of the total thickness dt, since a big tensile strain acts on the light conversion layer 30, failure such as cracking of the light conversion layer 30 may occur.

When the separation distance dn is set to be greater than 20% of the total thickness dt, since the pattern layer 20 becomes far from the neutral region NP, the compressive strain which acts on the pattern layer 20 is increased, the pattern layer 20 cracks, and thus a failure in which wires or electrodes inside the touch module 1 become broken may occur.

By setting the separation distance dn in the range of 3 to 20% of the total thickness dt, a disconnection failure of the pattern layer 20 and a failure due to damage of the light conversion layer 30 may be prevented, and thus there is an effect of an increased production yield of the touch module 1.

Figure 4:
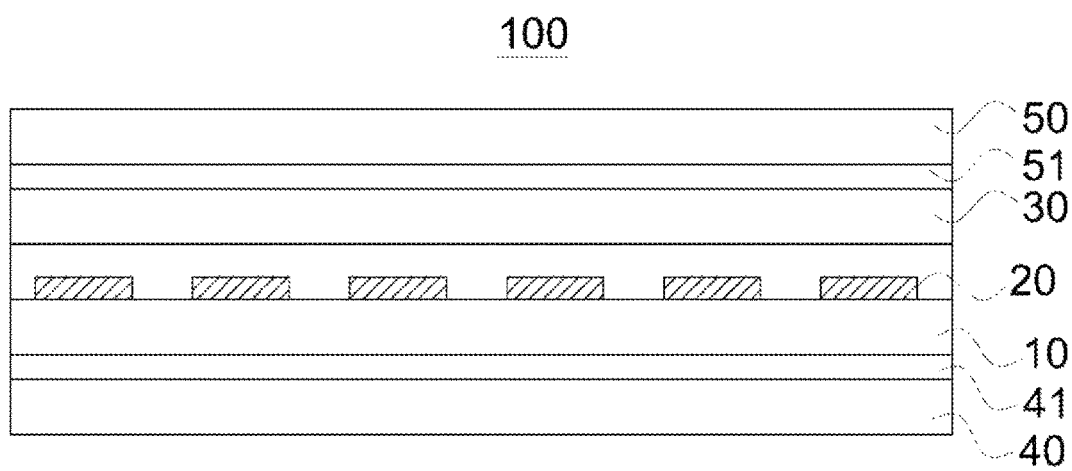
FIG. 4 is a cross-sectional view illustrating a display device according to a second embodiment.

FIG. 4 is a cross-sectional view illustrating a display device according to a second embodiment.

The display device according to the second embodiment is the same as the first embodiment except that a cover film and a display panel are added to the first embodiment. Accordingly, in descriptions of the second embodiment, components which are the same as those of the first embodiment are assigned to the same reference numerals, and the detail descriptions thereof will be omitted.

Referring to FIG. 4, a display device 100 according to the second embodiment includes a substrate 10, a pattern layer 20, a light conversion layer 30, a display panel 40, and a cover film 50.

The pattern layer 20 may be formed on the substrate 10. The pattern layer 20 may include electrode patterns 21 and interconnection patterns 23.

The light conversion layer 30 may be positioned on the pattern layer 20. The light conversion layer 30 may include a polarizer. The light conversion layer 30 may include the polarizer and a retardation plate.

The display panel 40 may be positioned under the substrate 10, and the cover film 50 may be positioned on the light conversion layer 30.

The display panel 40 may include a display panel which displays images. The display panel 40 may include a liquid crystal panel or an organic light emitting panel.

When the display panel 40 includes the organic light emitting panel, strength of the display panel 40 may be in a range of 1 to 100 MPa.

When the strength of the display panel 40 is less than 1 MPa, a failure such as cracking of the display panel 40 may occur when the display panel 40 is repeatedly bent because the strength thereof is degraded.

When the strength of the display panel 40 is greater than 100 MPa, since compressive strain which acts when the display panel 40 is bent is increased due to the high strength, there may be a problem of the display panel 40 cracking when the display panel 40 is repeatedly bent.

By forming the display panel 40 to have the strength in the range of 1 to 100 MPa, failures due to damage of the display panel 40 may be prevented even when the display panel 40 is repeatedly bent, and thus there is an effect of an increased production yield.

The display panel 40 may be attached to the substrate 10 by a first bonding layer 41. The first bonding layer 41 may include an optically transparent adhesive. A front surface of the display panel 40 is coated with the first bonding layer 41 to be adhered to the substrate 10, or a partial region of the display panel 40 is coated with the first bonding layer 41 to be adhered to the substrate 10.

Strength of the cover film 50 may be in a range of 1 to 100 MPa.

When the strength of the cover film 50 is less than 1 MPa, a failure such as cracking of the cover film 50 may occur when the cover film 50 is repeatedly bent because the strength thereof is degraded.

When the strength of the cover film 50 is greater than 100 MPa, since compressive strain which acts when the cover film 50 is bent is increased due to the high strength, there is a problem of the cover film 50 cracking when the cover film 50 is repeatedly bent.

By forming the cover film 50 to have the strength in the range of 1 to 100 MPa, since failures due to damage of the cover film 50 may be prevented even when the cover film 50 is repeatedly bent, there is an effect of an increased production yield.

The cover film 50 may be adhered to the light conversion layer 30 by a second bonding layer 51. The second bonding layer 51 may include an optically transparent adhesive. A front surface of the light conversion layer 30 may be coated with the second bonding layer 51 to be adhered to the cover film 50, or a partial region of the light conversion layer 30 may be coated with the second bonding layer 51 to be adhered to the cover film 50.

A total thickness of the display device 100 may be in a range of 40 to 388 μm.

When the total thickness of the display device 100 is less than 40 μm, handling during moving between processes is not easy, a failure possibility during processing increases.

When the total thickness of the display device 100 is greater than 388 μm, since compressive strain which acts when the display device 100 is bent increases, there is a problem of parts of components of the display device 100 cracking when the display device 100 is repeatedly bent.

By forming the display device 100 to have the total thickness in the rage of 40 to 388 μm, there is an effect of an increased production yield due to a reduced failure rate during processing or a failure rate due to damage.

Figure 5:
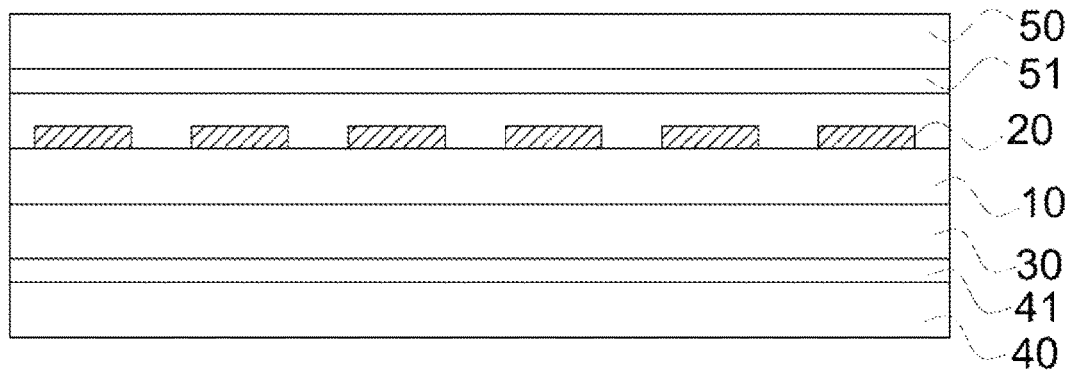
FIG. 5 is a view illustrating a display device according to a third embodiment.

FIG. 5 is a view illustrating a display device according to a third embodiment.

The display device according to the third embodiment has a light conversion layer at a position different from that of the second embodiment but has the same remaining structure as that of the second embodiment. Accordingly, in descriptions of the third embodiment, the components which are the same as those of the second embodiment are assigned to the same reference numerals, and the detail descriptions thereof will be omitted.

Referring to FIG. 5, a display device 100 according to the third embodiment includes a substrate 10, a pattern layer 20, a light conversion layer 30, a display panel 40, and a cover film 50.

The pattern layer 20 may be formed on the substrate 10. The pattern layer 20 may include electrode patterns 21 and interconnection patterns 23.

The light conversion layer 30 may be positioned under the substrate 10. The light conversion layer 30 may include a polarizer. The light conversion layer 30 may include the polarizer and a retardation plate.

The display panel 40 may be positioned under the light conversion layer 30, and the cover film 50 may be positioned on the pattern layer 20.

The display panel 40 may include a display panel which displays images. The display panel 40 may include a liquid crystal panel or an organic light emitting panel.

The display panel 40 may be adhered to the light conversion layer 30 by a first bonding layer 41. The display panel 40 may be adhered under the light conversion layer 30 by the first bonding layer 41.

The cover film 50 may be adhered to the pattern layer 20 by the second bonding layer 51. The cover film 50 may be adhered on the pattern layer 20 by the second bonding layer 51. That is, the cover film 50 may be positioned on the light conversion layer 30. The cover film 50 may be positioned on the polarizer.

The cover film 50 may include at least one of cellulose triacetate, cellulose propionate, cellulose butyrate, cellulose acetate propionate, nitrocellulose, polyimide, polycarbonate, polyethylene terephthalate, polyehtylene naphthalate, poly-1,4-cyclohexane dimethylene terephthalate, polyethylene 1,2-diphenoxy ethane-4,4'-dicarboxylate, polybutylene-terephtalate, polystyrene, polypropylene, polyethylene, polymethylpentene, polysulphone, polyethersulphone, polyallylate, polyetherimide, polymethylmetaacrylate, polyetherkethone, polyvinyl alcohol, and polyvinyl chloride cyclo olefin.

The cover film 50 may include a single layer including any one material among the above materials, and the cover film 50 may include a composite multilayered layer including at least two different materials among the above materials.

Figure 6:
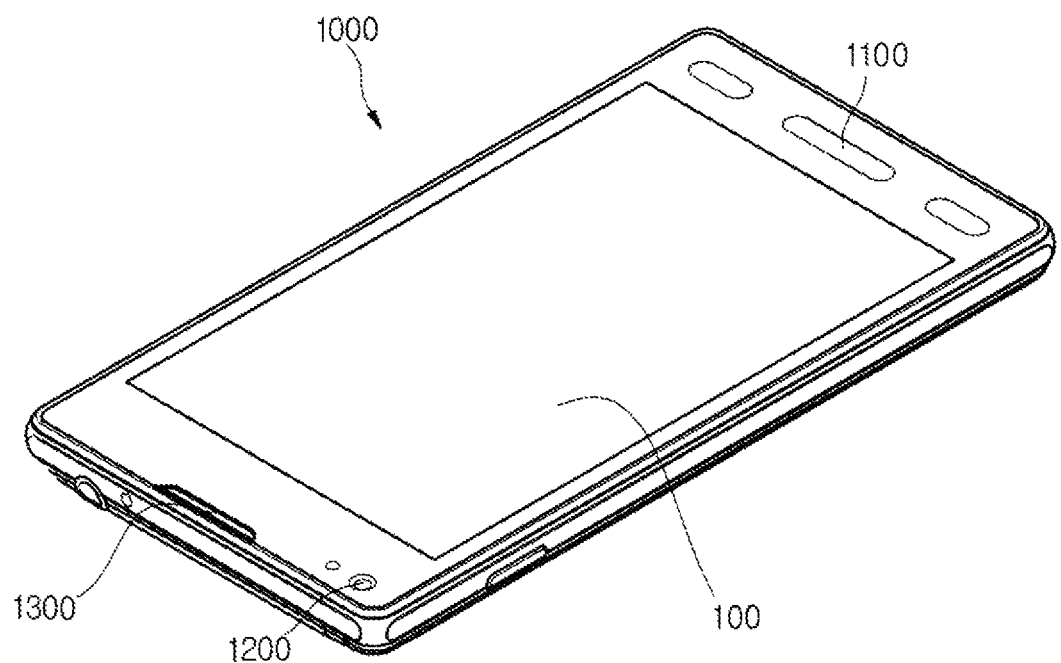
FIG. 6 is a perspective view illustrating a device to which the touch module and the display device according to the first to third embodiments are applied.

FIG. 6 is a perspective view illustrating a device to which the touch module and the display device according to the first to third embodiments are applied.

Referring to FIG. 6, an input button 1100 for inputting a command from the outside, a camera 1200 for taking still images and moving images, and a speaker 1300 which outputs a sound may be formed in the device 1000.

The device 1000 may include a touch module 1 or a display device 100.

The touch module 1 or the display device may be applied to various devices such as a mobile phone, a TV set, a navigation device.

Although a display device to which a touch module according to the embodiments of the present invention is applied was described as an example, the present invention is not limited to the device to which the touch module is applied and may be used for various products such as a key pad, a touch pad for a notebook, a touch input device for a vehicle.

While the structures and features of the present invention were described on the basis of the embodiments of the present invention, the present invention is not limited thereto, it is apparent to those skilled in the art that the present invention may be variously modified or changed in the scope of the present invention, and accordingly it is clear that such modifications or changes are within the scope of the appended claims.

INDUSTRIAL APPLICABILITY

The present invention relates to a polarizing plate-integrated touch sensor and is industrially applicable.

The invention claimed is:
1. A touch sensor integrated with a polarizer, comprising:
a polarizer; and
a touch sensor disposed above a side of one surface of the polarizer, and including electrode patterns and a substrate, the electrode patterns formed on a surface of the substrate,
wherein the sum of thicknesses of the polarizer and the touch sensor is in a range of 30 to 300 µm; and strength of the substrate is IMPa or more, and
wherein a distance between a neutral region and the electrode patterns of the touch sensor integrated with the polarizer is in a range of 3% to 20% of a thickness of the touch sensor integrated with a polarizer.

2. The touch sensor integrated with a polarizer in claim 1, wherein the polarizer is positioned on the electrode patterns.

3. The touch sensor integrated with a polarizer in claim 1, wherein the polarizer is positioned under the substrate.

4. The touch sensor integrated with a polarizer in claim 1, wherein the polarizer further includes a retardation plate.

5. The touch sensor integrated with a polarizer in claim 1, wherein a thickness of the touch sensor is in a range of 15 µm to 50 µm.

6. The touch sensor integrated with a polarizer in claim 1, wherein a thickness of the polarizer is in a range of 5 µm to 100 µm.

7. The touch sensor integrated with a polarizer in claim 4, wherein a thickness of the retardation plate is in a range of 10 µm to 25 µm.

8. The touch sensor integrated with a polarizer in claim 1, further comprising a passivation layer formed on the electrode patterns.

9. The touch sensor integrated with a polarizer in claim 1, wherein the electrode patterns are formed of molybdenum, silver, aluminum, copper, palladium, gold, platinum, zinc, titanium, chrome, nickel, tungsten, or an alloy including two or more thereof, or formed of indium tin oxide (ITO), indium zinc oxide (IZO), zinc oxide (ZnO), indium zinc tin oxide (IZTO), cadmium tin oxide (CTO), copper oxide (CO), poly 3,4-ethylenedioxythiophene (PEDOT), a nanowire, a nanofiber, carbon nanotube (CNT), or graphene.

10. The touch sensor integrated with a polarizer in claim 1, further comprising a cover film positioned on the touch sensor.

11. An organic light emitting display device comprising the touch sensor integrated with the polarizer of claim 1.

12. The organic light emitting display device in claim 11, wherein a thickness of the organic light emitting display device including the touch sensor integrated with the polarizer is in a range of 40 to 388 µm.

* * * * *